US012793645B2

(12) United States Patent
Jang et al.

(10) Patent No.: US 12,793,645 B2
(45) Date of Patent: Nov. 10, 2026

(54) DISPLAY DEVICE HAVING CRACK DETECTION LINE OVERLAPPING SPIDER LINES IN NON-DISPLAY AREA

(71) Applicant: SAMSUNG DISPLAY CO., LTD., Yongin-si (KR)

(72) Inventors: Donghyeon Jang, Yongin-si (KR); Wonse Lee, Yongin-si (KR); Daesuk Kim, Yongin-si (KR); Il Goo Youn, Yongin-si (KR); Sujin Lee, Yongin-si (KR); Sukyo Jung, Yongin-si (KR); Mincheol Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 370 days.

(21) Appl. No.: 18/500,874

(22) Filed: Nov. 2, 2023

(65) Prior Publication Data

US 2024/0274083 A1 Aug. 15, 2024

(30) Foreign Application Priority Data

Feb. 13, 2023 (KR) ........................ 10-2023-0018835

(51) Int. Cl.
*G09G 3/3258* (2016.01)
*H10K 59/131* (2023.01)
*H10K 102/00* (2023.01)

(52) U.S. Cl.
CPC ......... *G09G 3/3258* (2013.01); *H10K 59/131* (2023.02); *H10K 2102/341* (2023.02)

(58) Field of Classification Search
CPC ........................... G09G 3/3258; H10K 59/131
See application file for complete search history.

(56) References Cited

U.S. PATENT DOCUMENTS

2019/0019441 A1* 1/2019 Shin ..................... G09G 3/3233
2019/0355799 A1 11/2019 Jeong et al.
2020/0203641 A1* 6/2020 Lee ...................... H10K 59/131
2020/0212132 A1 7/2020 Kim et al.
2021/0110745 A1* 4/2021 Jung ...................... G09G 3/006
2021/0313414 A1 10/2021 Park et al.
2021/0367000 A1* 11/2021 Kim ...................... G06F 3/0446
(Continued)

FOREIGN PATENT DOCUMENTS

KR 10-1279117 6/2013
KR 10-2019-0007570 A 1/2019
(Continued)

OTHER PUBLICATIONS

Korean Office Action dated Aug. 20, 2026, issued in corresponding Korean Patent Application No. 10-2023-0018835 (13 pages, including 7 pages of English translation).

*Primary Examiner* — Michael Jung
(74) *Attorney, Agent, or Firm* — Womble Bond Dickinson (US) LLP

(57) ABSTRACT

A display device includes a substrate including a display area and a non-display area including a line area adjacent to a side of the display area, a crack detection line on the substrate in the non-display area, extending to the line area, and including a first line part and a second line part connected to the first line part, and a plurality of spider lines on the substrate in the line area to receive a data voltage, and overlapping the first line part and not overlapping the second line part on a plane.

20 Claims, 11 Drawing Sheets

(56) References Cited

U.S. PATENT DOCUMENTS

| | | | |
|---|---|---|---|
| 2022/0254285 | A1 | 8/2022 | Wang et al. |
| 2022/0271102 | A1* | 8/2022 | Kim ..................... G09G 3/3233 |
| 2024/0188353 | A1 | 6/2024 | Zhang et al. |

FOREIGN PATENT DOCUMENTS

| | | | |
|---|---|---|---|
| KR | -10-2019-0132603 | A | 11/2019 |
| KR | 10-2020-0066473 | | 6/2020 |
| KR | 10-2021-0157382 | | 12/2021 |
| WO | WO 2023/000122 | A1 | 1/2023 |

* cited by examiner

T3:T3-1,T3-2
T4:T4-1,T4-2

DISPLAY DEVICE HAVING CRACK DETECTION LINE OVERLAPPING SPIDER LINES IN NON-DISPLAY AREA

CROSS-REFERENCE TO RELATED APPLICATION

This application claims priority to and benefit of Korean Patent Application No. 10-2023-0018835, filed on Feb. 13, 2023 in the Korean Intellectual Property Office, the entire content of which is herein incorporated by reference.

BACKGROUND

1. Field

Aspects of embodiments of the present disclosure relate to a display device.

2. Description of Related Art

With the development of information technology, the importance of a display device, which is a connection medium between a user and information, has been highlighted. For example, the use of display devices, such as a liquid crystal display device ("LCD"), an organic light emitting display device ("OLED"), a plasma display device ("PDP"), a quantum dot display device, or the like, is increasing.

The display device may include a display area displaying an image and a non-display area not displaying an image. In order to increase an area occupied by the display area in the display device, research is being conducted to reduce an area occupied by the non-display area.

SUMMARY

According to an aspect of embodiments of the present disclosure, a display device that provides visual information is provided. According to another aspect of embodiments of the present disclosure, a display device having a relatively small non-display area is provided.

According to another aspect of embodiments of the present disclosure, a display device capable of preventing or substantially preventing an electrical short between lines is provided.

According to one or more embodiments of the present disclosure, a display device includes a substrate including a display area and a non-display area including a line area adjacent to a side of the display area, a crack detection line on the substrate in the non-display area, extending to the line area, and including a first line part and a second line part connected to the first line part, and a plurality of spider lines on the substrate in the line area to receive a data voltage, and overlapping the first line part and not overlapping the second line part on a plane.

In an embodiment, the first line part may be on a different layer from the second line part.

In an embodiment, the first line part may be above the second line part.

In an embodiment, the display device may further include a plurality of data lines on the substrate in the display area, extending in a first direction, and arranged along a second direction crossing the first direction. In addition, each of the plurality of spider lines may extend in a first diagonal direction between the first direction and the second direction in the line area.

In an embodiment, the plurality of spider lines may include first spider lines and second spider lines. In addition, the first spider lines and the second spider lines may be alternately arranged along a second diagonal direction crossing the first diagonal direction.

In an embodiment, the first spider lines may be on a different layer from the second spider lines.

In an embodiment, the display device may further include a first active pattern on the substrate in the display area, a first gate electrode on the first active pattern, a second gate electrode on the first gate electrode, a second active pattern on the second gate electrode, a third gate electrode on the second active pattern, a source electrode and a drain electrode on the third gate electrode, and a connection electrode on the drain electrode.

In an embodiment, a part of the plurality of spider lines may be on a same layer as the first gate electrode, and another part of the plurality of spider lines may be on a same layer as the second gate electrode.

In an embodiment, the first line part of the crack detection line may be on a same layer as the connection electrode, and the second line part of the crack detection line may be on a same layer as the source electrode and the drain electrode.

In an embodiment, the first line part of the crack detection line may be on a same layer as the third gate electrode, and the second line part of the crack detection line may be on a same layer as the source electrode and the drain electrode.

In an embodiment, the display device may further include a pad portion on the substrate in the non-display area. In addition, an end of the crack detection line may be connected to the pad portion.

According to one or more embodiments of the present disclosure, a display device includes a substrate including a display area and a non-display area including a first line area adjacent to a side of the display area and a second line area adjacent to the first line area and extending in a second direction crossing a first direction, a plurality of data lines on the substrate in the display area, extending in the first direction, and arranged along the second direction, a crack detection line on the substrate in the non-display area, extending to the first line area and the second line area, and including a first line part and a second line part connected to the first line part, and a plurality of spider lines on the substrate in the first line area and the second line area, connected to the plurality of data lines, overlapping the first line part on a plane in the first line area, not overlapping the second line part on the plane in the first line area, and spaced apart from the crack detection line on the plane in the second line area.

In an embodiment, the first line part may be on a different layer from the second line part.

In an embodiment, the plurality of spider lines may extend in a diagonal direction between the first direction and the second direction in the first line area. In addition, the plurality of spider lines may extend in the second direction in the second line area.

In an embodiment, the display device may further include a first active pattern on the substrate in the display area, a first gate electrode on the first active pattern, a second gate electrode on the first gate electrode, a second active pattern on the second gate electrode, a third gate electrode on the second active pattern, a source electrode and a drain electrode on the third gate electrode, and a connection electrode on the drain electrode.

In an embodiment, the first line part of the crack detection line may be on a same layer as the connection electrode, and the second line part of the crack detection line may be on a same layer as the source electrode and the drain electrode.

In an embodiment, the first line part of the crack detection line may be on a same layer as the third gate electrode, and the second line part of the crack detection line may be on a same layer as the source electrode and the drain electrode.

In an embodiment, the display device may further include a common voltage line on the substrate in the non-display area and extending in the first line area and the second line area.

In an embodiment, the common voltage line may at least partially overlap the plurality of spider lines on the plane in the first line area and the second line area. In addition, the common voltage line may include a first layer on a same layer as the source electrode and the drain electrode and a second layer on a same layer as the connection electrode.

In an embodiment, in the second line area, the crack detection line may be between spider lines overlapping the common voltage line on the plane and spider lines not overlapping the common voltage line on the plane among the plurality of spider lines.

A display device according to embodiments of the present disclosure may include a substrate including a display area and a non-display area including a first line area adjacent to a side of the display area, spider lines disposed on the substrate in the first line area, and a crack detection line including a first line part overlapping the spider lines on a plane and a second line part not overlapping the spider lines on a plane.

By disposing, or arranging, the crack detection line to at least partially overlap the spider lines on a plane in the first line area, an area of the non-display area of the display device may be relatively reduced.

In one or more embodiments, the first line part may be disposed on a layer other than a layer on which a source electrode and a drain electrode are disposed. Accordingly, even if a defect in which a metal film remains occurs in a process of forming the spider lines, the first line part may not be electrically shorted to a common voltage line.

BRIEF DESCRIPTION OF THE DRAWINGS

Some illustrative, non-limiting embodiments will be more clearly understood from the following detailed description in conjunction with the accompanying drawings.

DETAILED DESCRIPTION

Figure 1:
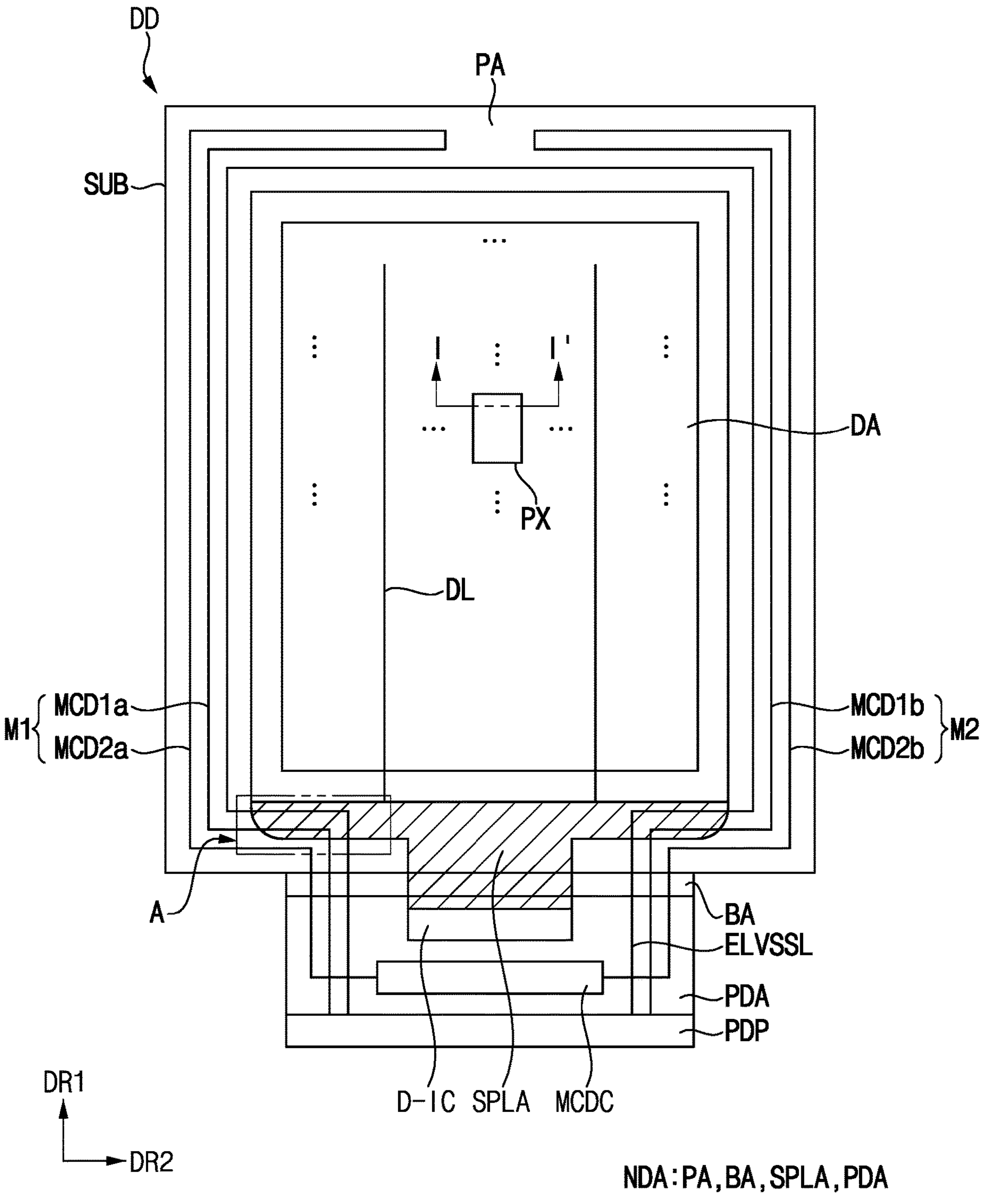
FIG. 1 is a plan view illustrating a display device according to an embodiment of the present disclosure.

Herein, some embodiments of the present disclosure will be described in further detail with reference to the accompanying drawings. The same reference numerals are used for the same components in the drawings, and redundant descriptions of the same components may be omitted.

Figure 2:
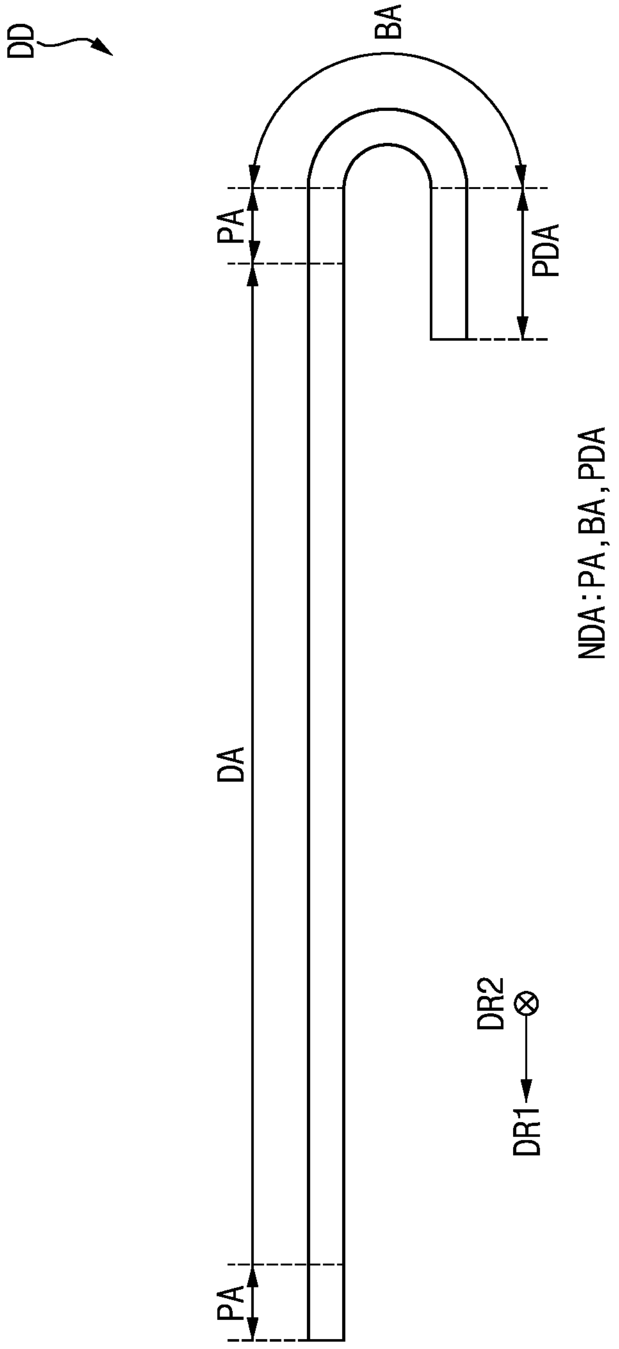
FIG. 2 is a cross-sectional view illustrating a bent state of the display device of FIG. 1.

FIG. 1 is a plan view illustrating a display device according to an embodiment of the present disclosure; and FIG. 2 is a cross-sectional view illustrating a bent state of the display device of FIG. 1.

In this specification, a plane may be defined by a first direction DR1 and a second direction DR2 crossing the first direction DR1. For example, the first direction DR1 and the second direction DR2 may be perpendicular to each other.

Referring to FIG. 1, a display device DD according to an embodiment may include a substrate SUB, a pad portion PDP, a driving chip D-IC, a crack detection circuit portion MCDC, a first crack detection portion M1, a second crack detection portion M2, a common voltage line ELVSSL, and data lines DL.

The substrate SUB may include a display area DA and a non-display area NDA. The display area DA may be defined as an area displaying an image by generating light or adjusting transmittance of light provided from an external light source. A plurality of pixels PX may be disposed in the display area DA. The pixels PX may generate light according to a driving signal. The pixels PX may be repeatedly arranged along the first direction DR1 and the second direction DR2.

The data lines DL connected to the pixels PX may be further disposed in the display area DA. The data lines DL may extend along the first direction DR1 and may be disposed, or arranged, along the second direction DR2 on the substrate SUB in the display area DA. In addition, gate lines and power supply lines connected to the pixels PX may be disposed on the substrate SUB in the display area DA.

The non-display area NDA may be defined as an area not displaying an image. The non-display area NDA may include a peripheral area PA, a bending area BA, a line area SPLA, and a pad area PDA.

The peripheral area PA may be positioned around the display area DA. For example, the peripheral area PA may surround (e.g., entirely surround) the display area DA.

As illustrated in FIG. 2, the bending area BA may extend from a side of the peripheral area PA and may be bent downward. In other words, when the bending area BA is bent about the second direction DR2 as an axis, the pad area PDA may be positioned on a lower surface of the display device DD. The pad area PDA may extend from the bending area BA and be positioned under the display area DA or the peripheral area PA. As illustrated in FIG. 1, when the display device DD is unfolded, the bending area BA may be positioned between the display area DA and the pad area PDA.

The pad portion PDP may be disposed on the substrate SUB in the pad area PDA. The pad portion PDP may be electrically connected to the driving chip D-IC or a circuit board.

The driving chip D-IC may be disposed on the substrate SUB in the pad area PDA. The driving chip D-IC may convert a digital data signal among the driving signal into an analog data signal and provide the converted analog data signal to the pixels PX. For example, the driving chip D-IC may be a data driver.

The first crack detection portion M1 and the second crack detection portion M2 may be disposed on the substrate SUB in the non-display area NDA. In an embodiment, the first crack detection portion M1 may be positioned in the lower, left, and upper peripheral area PA around the display area DA. In addition, the second crack detection portion M2 may be positioned in the lower, right, and upper peripheral area PA around the display area DA.

The first crack detection portion M1 may include a first crack detection line MCD1*a* and a second crack detection line MCD2*a*. A first end of the first crack detection line MCD1*a* may be connected to the pad portion PDP disposed on the substrate SUB in the pad area PDA. A test voltage (e.g., a high voltage) may be provided to the first crack detection line MCD1*a* through the pad portion PDP. The first crack detection line MCD1*a* may be disposed in the pad area PDA and may extend to the bending area BA and the peripheral area PA. A second end of the first crack detection line MCD1*a* may be connected to a first end of the second crack detection line MCD2*a* in the peripheral area PA.

The first end of the second crack detection line MCD2*a* may be connected to the second end of the first crack detection line MCD1*a* on the substrate SUB in the peripheral area PA. The second crack detection line MCD2*a* may be disposed in the peripheral area PA and may extend to the bending area BA and the pad area PDA. In an embodiment, the first crack detection line MCD1*a* and the second crack detection line MCD2*a* may extend side by side along an edge of the display area DA. A second end of the second crack detection line MCD2*a* may be connected to the crack detection circuit portion MCDC disposed on the substrate SUB in the pad area PDA.

The first crack detection line MCD1*a* may extend to the line area SPLA. Accordingly, the first crack detection wire MCD1*a* may partially overlap spider lines (e.g., spider lines SPL of FIG. 5) on a plane. A further detailed description thereof will be provided later with reference to FIG. 5.

The second crack detection portion M2 may include a first crack detection line MCD1*b* and a second crack detection line MCD2*b*. In an embodiment, the first crack detection line MCD1*b* of the second crack detection portion M2 and the first crack detection line MCD1*a* of the first crack detection portion M1 may have substantially the same or symmetric shapes. In addition, the second crack detection line MCD2*b* of the second crack detection portion M2 and the second crack detection line MCD2*a* of the first crack detection portion M1 may have substantially the same or symmetric shapes. Therefore, herein, the first crack detection portion M1 will be mainly described. A description of the first crack detection portion M1 may replace a description of the second crack detection portion M2.

The common voltage line ELVSSL may be disposed on the substrate SUB in the non-display area NDA. For example, the common voltage line ELVSSL may be disposed to surround at least a portion of the display area DA. At least a portion of the common voltage line ELVSSL may be connected to the pad portion PDP.

The common voltage line ELVSSL may provide a common voltage (e.g., a common voltage ELVSS of FIG. 3) to the pixels PX. In an embodiment, the common voltage line ELVSSL may be electrically connected to a common electrode (e.g., a common electrode CTE of FIG. 4) in the non-display area NDA to provide the common voltage to the common electrode.

The common voltage line ELVSSL may extend to the line area SPLA. Accordingly, the common voltage line ELVSSL may partially overlap the spider lines on a plane. A further detailed description thereof will be provided later with reference to FIG. 5.

The crack detection circuit portion MCDC may be disposed on the substrate SUB in the pad area PDA. The crack detection circuit portion MCDC may include a plurality of switching elements. The crack detection circuit portion MCDC may detect defects such as cracks occurring in the non-display area NDA through resistance changes of the first and second crack detection portions M1 and M2. Resistance changes of the first and second crack detection portions M1 and M2 may be confirmed by examining the lighting state of the display area DA through the crack detection circuit portion MCDC.

The line area SPLA may be adjacent to a side of the display area DA. The line area SPLA may extend in the first direction DR1 from a side of the display area DA. The line area SPLA may be defined as an area in which lines that are electrically connected to a plurality of lines (e.g., the data lines DL) disposed in the display area DA are disposed outside the display area DA. The spider lines may be disposed in the line area SPLA. The spider lines may electrically connect the data lines DL and the driving chip D-IC. In addition, the spider lines may receive a data voltage from the driving chip D-IC.

In an embodiment, the display device DD may be a smart watch. The smart watch may refer to a device that combines communication and computing functions in a watch. However, the present disclosure is not limited thereto.

Figure 3:
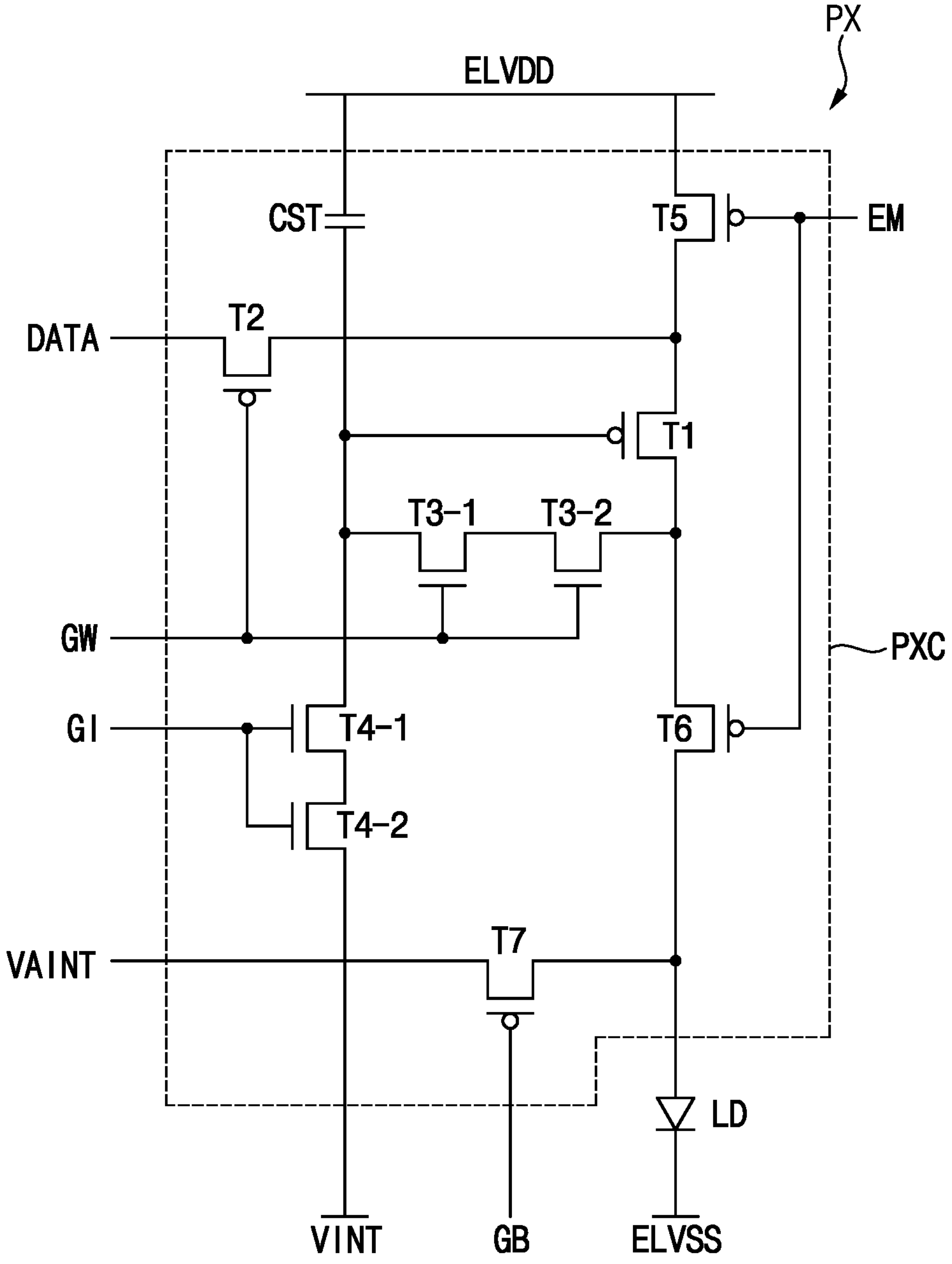
FIG. 3 is a circuit diagram illustrating an example of a pixel included in a display area of the display device of FIG. 1.

FIG. 3 is a circuit diagram illustrating an example of a pixel disposed in a display area of the display device of FIG. 1.

Referring to FIG. 3, each pixel PX may include a pixel circuit PXC and a light emitting element LD electrically connected to the pixel circuit PXC. In this case, the pixel circuit PXC may include a first transistor T1, a second transistor T2, a third transistor T3, a fourth transistor T4, a fifth transistor T5, a sixth transistor T6, a seventh transistor T7, and a storage capacitor CST. However, the present disclosure is not limited thereto, and some of the components of the pixel circuit PXC may be omitted and other components may be added.

The first transistor T1 may include a gate electrode, a first electrode, and a second electrode. The first transistor T1 may generate a driving current based on a voltage difference between the gate electrode and the first electrode. For example, the first transistor T1 may be referred to as a driving transistor.

The second transistor T2 may include a gate electrode, a first electrode, and a second electrode. The gate electrode of the second transistor T2 may receive a first gate signal GW. The first electrode of the second transistor T2 may receive a data voltage DATA. The second electrode of the second transistor T2 may be connected to the first electrode of the first transistor T1. While the second transistor T2 is turned on in response to the first gate signal GW, the second transistor T2 may provide the data voltage DATA to the first electrode of the first transistor T1. For example, the second transistor T2 may be referred to as a writing transistor.

The third transistor T3 may include a gate electrode, a first electrode, and a second electrode. The gate electrode of the third transistor T3 may receive the first gate signal GW. The first electrode of the third transistor T3 may be connected to the gate electrode of the first transistor T1. The second electrode of the third transistor T3 may be connected to the second electrode of the first transistor T1. While the third transistor T3 is turned on in response to the first gate signal GW, the third transistor T3 may diode-connect the first transistor T1. In other words, the third transistor T3 may compensate for the threshold voltage of the first transistor T1. For example, the third transistor T3 may be referred to as a compensation transistor.

In an embodiment, as illustrated in FIG. 3, the third transistor T3 may have a dual transistor structure in which two third transistors T3-1 and T3-2 are connected in series. In another embodiment, the third transistor T3 may have a single transistor structure.

The fourth transistor T4 may include a gate electrode, a first electrode, and a second electrode. The gate electrode of the fourth transistor T4 may receive a second gate signal GI. The first electrode of the fourth transistor T4 may receive a gate initialization voltage VINT. The second electrode of the fourth transistor T4 may be connected to the gate electrode of the first transistor T1. While the fourth transistor T4 is turned on in response to the second gate signal GI, the fourth transistor T4 may provide the gate initialization voltage VINT to the gate electrode of the first transistor T1. For example, the fourth transistor T4 may be referred to as a gate initialization transistor.

Figure 4:
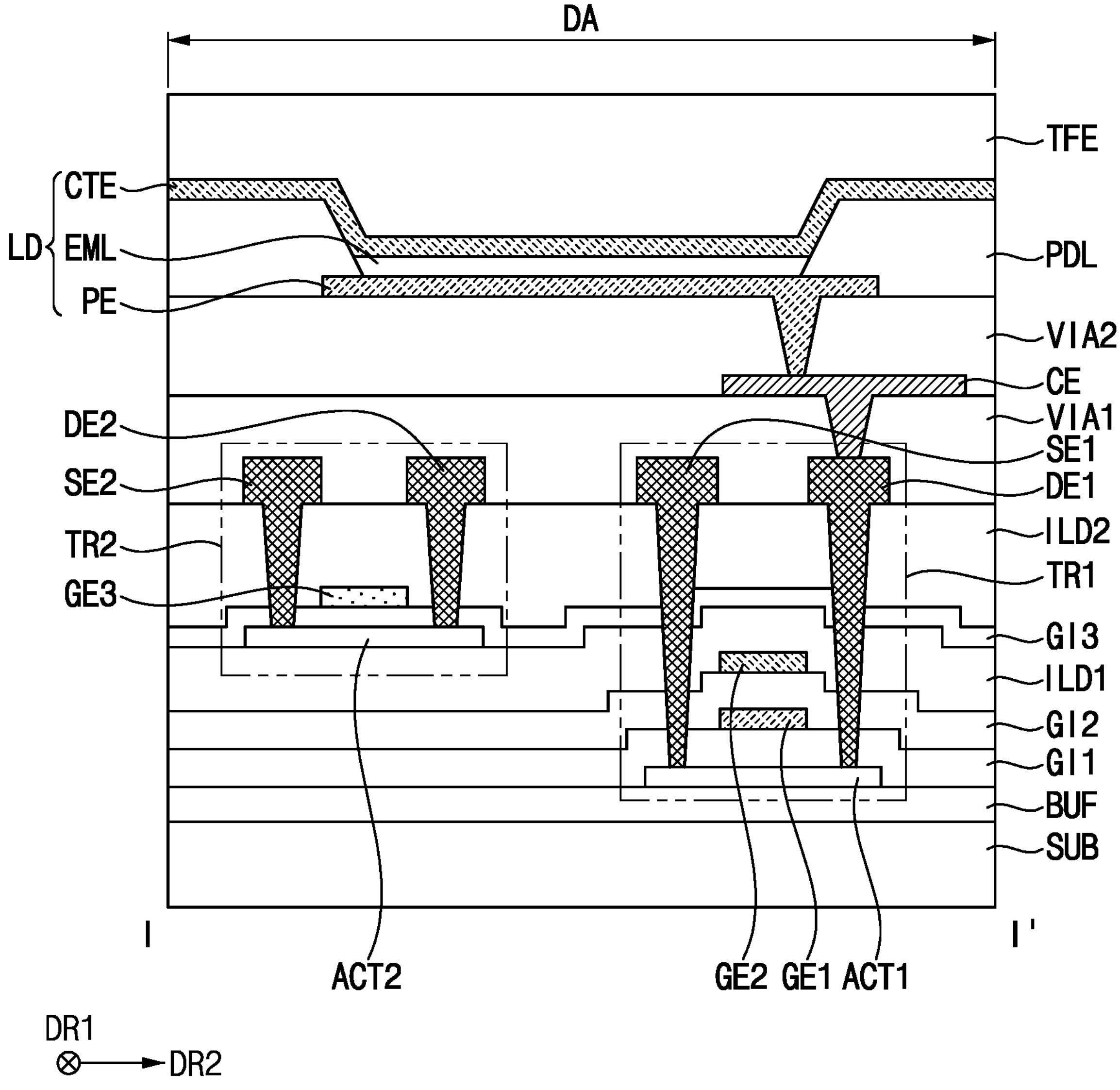
FIG. 4 is a cross-sectional view taken along the line I-I' of FIG. 1.

In an embodiment, as illustrated in FIG. 4, the fourth transistor T4 may have a dual transistor structure in which two fourth transistors T4-1 and T4-2 are connected in series. In another embodiment, the fourth transistor T4 may have a single transistor structure.

The fifth transistor T5 may include a gate electrode, a first electrode, and a second electrode. The gate electrode of the fifth transistor T5 may receive a light emitting control signal EM. The first electrode of the fifth transistor T5 may receive a driving voltage ELVDD. The second electrode of the fifth transistor T5 may be connected to the first electrode of the first transistor T1. While the fifth transistor T5 is turned on in response to the light emitting control signal EM, the fifth transistor T5 may provide the driving voltage ELVDD to the first electrode of the first transistor T1. For example, the fifth transistor T5 may be referred to as a first light emitting control transistor.

The sixth transistor T6 may include a gate electrode, a first electrode, and a second electrode. The gate electrode of the sixth transistor T6 may receive the light emitting control signal EM. The first electrode of the sixth transistor T6 may be connected to the second electrode of the first transistor T1. The second electrode of the sixth transistor T6 may be connected to a first electrode of the light emitting element LD. While the sixth transistor T6 is turned on in response to the light emitting control signal EM, the sixth transistor T6 may provide the driving current generated by the first transistor T1 to the light emitting element LD. For example, the sixth transistor T6 may be referred to as a second light emitting control transistor.

The seventh transistor T7 may include a gate electrode, a first electrode, and a second electrode. The gate electrode of the seventh transistor T7 may receive a third gate signal GB. The first electrode of the seventh transistor T7 may receive an anode initialization voltage VAINT. The second electrode of the seventh transistor T7 may be connected to the first electrode of the light emitting element LD. While the seventh transistor T7 is turned on in response to the third gate signal GB, the seventh transistor T7 may provide the anode initialization voltage VAINT to the first electrode of the light emitting element LD. For example, the seventh transistor T7 may be referred to as an anode initialization transistor.

In an embodiment, each of the first transistor T1, the second transistor T2, the fifth transistor T5, the sixth transistor T6, and the seventh transistor T7 may be a PMOS transistor. In addition, each of the third transistor T3 and the fourth transistor T4 may be an NMOS transistor. Accordingly, in an embodiment, an active pattern of each of the first transistor T1, the second transistor T2, the fifth transistor T5, the sixth transistor T6, and the seventh transistor T7 may include a silicon semiconductor doped with cations. In addition, an active pattern of each of the third transistor T3 and the fourth transistor T4 may include an oxide semiconductor.

The storage capacitor CST may include a first electrode and a second electrode. The first electrode of the storage capacitor CST may receive the driving voltage ELVDD. The second electrode of the storage capacitor CST may be connected to the gate electrode of the first transistor T1.

The light emitting element LD may include the first electrode and a second electrode. The second electrode of the light emitting element LD may receive a common voltage ELVSS. The light emitting element LD may generate light having a luminance corresponding to the driving current. For example, the first electrode of the light emitting element LD may be an anode electrode, and the second electrode of the light emitting element LD may be a cathode electrode. Alternatively, the first electrode of the light emitting element LD may be a cathode electrode, and the second electrode of the light emitting element LD may be an anode electrode.

FIG. 4 is a cross-sectional view taken along the line I-I' of FIG. 1.

Referring to FIG. 4, the display device DD according to an embodiment of the present disclosure may include the substrate SUB, a buffer layer BUF, a first transistor TR1, a second transistor TR2, a first gate insulating layer GI1, a second gate insulating layer GI2, a third gate insulating layer GI3, a first inter-layer insulating layer ILD1, a second inter-layer insulating layer ILD2, a first via insulating layer VIA1, a second via insulating layer VIA2, a connection electrode CE, a pixel defining layer PDL, the light emitting element LD, and an encapsulation layer TFE.

The first transistor TR1 may include a first active pattern ACT1, a first gate electrode GE1, a second gate electrode GE2, a first source electrode SE1, and a first drain electrode DE1. The second transistor TR2 may include a second active pattern ACT2, a third gate electrode GE3, a second source electrode SE2, and a second drain electrode DE2. In addition, the light emitting element LD may include a pixel electrode PE, a light emitting layer EML, and a common electrode CTE.

The substrate SUB may include a transparent material or an opaque material. In an embodiment, the substrate SUB may be formed of a transparent resin substrate. Examples of the transparent resin substrate include a polyimide substrate and the like. In this case, the polyimide substrate may include a first organic layer, a first barrier layer, a second organic layer, etc. In another embodiment, the substrate SUB may include a quartz substrate, a synthetic quartz substrate, a calcium fluoride substrate, a fluorine-doped quartz substrate, a soda-lime glass substrate, a non-alkali glass substrate, etc. These may be used alone or in combination with each other.

The buffer layer BUF may be disposed on the substrate SUB. The buffer layer BUF may prevent or substantially prevent diffusion of metal atoms or impurities from the substrate SUB to an upper structure (e.g., the first transistor TR1 and the second transistor TR2, etc.). In addition, the buffer layer BUF may improve the flatness of the surface of the substrate SUB when the surface of the substrate SUB is not uniform. For example, the buffer layer BUF may include an inorganic material, such as silicon oxide, silicon nitride, silicon oxynitride, etc. These may be used alone or in combination with each other.

The first active pattern ACT1 may be disposed on the buffer layer BUF. In an embodiment, the first active pattern ACT1 may include amorphous silicon, polycrystalline silicon, etc. The first active pattern ACT1 may have a first source area, a first drain area, and a first channel area positioned between the first source area and the first drain area.

The first gate insulating layer GI1 may be disposed on the buffer layer BUF. In an embodiment, the first gate insulating layer GI1 may cover the first active pattern ACT1 and may be disposed along the profile of the first active pattern ACT1 with a uniform thickness. In an embodiment, the first gate insulating layer GI1 may sufficiently cover the first active pattern ACT1 and may have a substantially flat upper surface without creating a step difference around the first active pattern ACT1. The first gate insulating layer GI1 may include an inorganic material. Examples of the inorganic material that may be used as the first gate insulating layer GI1 may include silicon oxide, silicon nitride, and silicon oxynitride, etc. These may be used alone or in combination with each other.

The first gate electrode GE1 may be disposed on the first gate insulating layer GI1. The first gate electrode GE1 may overlap the first channel area of the first active pattern ACT1. The first gate electrode GE1 may include a metal, an alloy, a metal nitride, a conductive metal oxide, a transparent conductive material, etc. Examples of a material that may be used as the gate electrode GE may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc. These may be used alone or in combination with each other.

The second gate insulating layer GI2 may be disposed on the first gate insulating layer GI1. In an embodiment, the second gate insulating layer GI2 may cover the first gate electrode GE1 and may be disposed along the profile of the first gate electrode GE1 with a uniform thickness. In an embodiment, the second gate insulating layer GI2 may sufficiently cover the first gate electrode GE1 and may have a substantially flat upper surface without creating a step difference around the first gate electrode GE1. The second gate insulating layer GI2 may include an inorganic material. Examples of the inorganic material that may be used as the second gate insulating layer GI2 may include silicon oxide, silicon nitride, and silicon oxynitride, etc. These may be used alone or in combination with each other.

The second gate electrode GE2 may be disposed on the second gate insulating layer GI2. The second gate electrode GE2 may overlap the first gate electrode GE1. For example, the second gate electrode GE2 may include a metal, an alloy, a metal nitride, a conductive metal oxide, a transparent conductive material, etc. These may be used alone or in combination with each other.

The first inter-layer insulating layer ILD1 may be disposed on the second gate insulating layer GI2. In an embodiment, the first inter-layer insulating layer ILD1 may cover the second gate electrode GE2 and may be disposed along the profile of the second gate electrode GE2 with a uniform thickness. In an embodiment, the first inter-layer insulating layer ILD1 may sufficiently cover the second gate electrode GE2 and may have a substantially flat upper surface without creating a step difference around the second gate electrode GE2. The first inter-layer insulating layer ILD1 may include an inorganic material. Examples of the inorganic material that may be used as the first interlayer insulating layer ILD1 may include silicon oxide, silicon nitride, and silicon oxynitride, etc. These may be used alone or in combination with each other.

The second active pattern ACT2 may be disposed on the first inter-layer insulating layer ILD1. In an embodiment, the second active pattern ACT2 may include a metal oxide semiconductor. For example, the metal oxide semiconductor may include a binary compound ($AB_x$), a ternary compound ($AB_xC_y$), a quaternary compound ($AB_xC_yD_z$), or the like, containing indium (In), zinc (Zn), gallium (Ga), tin (Sn), titanium (Ti), aluminum (Al), hafnium (Hf), zirconium (Zr), magnesium (Mg), etc. For example, the metal oxide semiconductor may include zinc oxide ($ZnO_x$), gallium oxide ($GaO_x$), tin oxide ($SnO_x$), indium oxide ($InO_x$), indium gallium oxide (IGO), and indium zinc oxide (IZO), indium tin oxide (ITO), indium zinc tin oxide (IZTO), indium gallium zinc oxide (IGZO), etc. These may be used alone or in combination with each other. The second active pattern ACT2 may have a second source area, a second drain area, and a second channel area positioned between the second source area and the second drain area.

The third gate insulating layer GI3 may be disposed on the first interlayer insulating layer ILD1. In an embodiment, the third gate insulating layer GI3 may cover the second active pattern ACT2 and may be disposed along the profile of the second active pattern ACT2 with a uniform thickness. In an embodiment, the third gate insulating layer GI3 may sufficiently cover the second active pattern ACT2 and may have a substantially flat upper surface without creating a step difference around the second active pattern ACT2. The third gate insulating layer GI3 may include an inorganic material. Examples of the inorganic material that may be used as the third gate insulating layer GI3 may include silicon oxide, silicon nitride, and silicon oxynitride, etc. These may be used alone or in combination with each other.

The third gate electrode GE3 may be disposed on the third gate insulating layer GI3. The third gate electrode GE3 may overlap the second channel area of the second active pattern ACT2. For example, the third gate electrode GE3 may include a metal, an alloy, a metal nitride, a conductive metal oxide, a transparent conductive material, etc. These may be used alone or in combination with each other.

The second inter-layer insulating layer ILD2 may be disposed on the third gate insulating layer GI3. In an embodiment, the second interlayer insulating layer ILD2 may sufficiently cover the third gate electrode GE3 and may have a substantially flat upper surface without creating a step difference around the third gate electrode GE3. In an embodiment, the second inter-layer insulating layer ILD2 may cover the third gate electrode GE3 and may be disposed along the profile of the third gate electrode GE3 with a uniform thickness. The second inter-layer insulating layer ILD2 may include an inorganic material. Examples of the inorganic material that may be used as the second inter-layer insulating layer ILD2 may include silicon oxide, silicon nitride, and silicon oxynitride, etc. These may be used alone or in combination with each other.

The first source electrode SE1 and a first drain electrode DE1 may be disposed on the second inter-layer insulating layer ILD2. The first source electrode SE1 may be connected to the first source area of the first active pattern ACT1 through a contact hole passing through insulating layers (e.g., the first to third gate insulating layers GI1, GI2, and GI3, and the first and second inter-layer insulating layers ILD1 and ILD2). The first drain electrode DE1 may be connected to the first drain area of the first active pattern ACT1 through a contact hole passing through the insulating layers (e.g., the first to third gate insulating layers GI1, GI2, and GI3, and the first and second inter-layer insulating layers ILD1 and ILD2). For example, the first source electrode SE1 and the first drain electrode DE1 may include a metal, an alloy, a metal nitride, a conductive metal oxide, a transparent conductive material, etc. These may be used alone or in combination with each other.

The second source electrode SE2 and the second drain electrode DE2 may be disposed on the second inter-layer insulating layer ILD2. The second source electrode SE2 may be connected to the second source area of the second active pattern ACT2 through a contact hole passing through the third gate insulating layer GI3 and the second inter-layer insulating layer ILD2. The second drain electrode DE2 may be connected to the second drain area of the second active pattern ACT2 through a contact hole passing through the third gate insulating layer GI3 and the second inter-layer insulating layer ILD2. In an embodiment, the second source electrode SE2 and the second drain electrode DE2 may include the same material as the first source electrode SE1 and the first drain electrode DE1 and may be disposed on the same layer.

Accordingly, the first transistor TR1 including the first active pattern ACT1, the first gate electrode GE1, the second gate electrode GE2, the first source electrode SE1, and the first drain electrode DE1 may be formed. In addition, the second transistor TR2 including the second active pattern ACT2, the third gate electrode GE3, the second source electrode SE2, and the second drain electrode DE2 may be formed.

The first via insulating layer VIA1 may be disposed on the second inter-layer insulating layer ILD2. The first via insulating layer VIA1 may be disposed with a relatively thick thickness to sufficiently cover the first source electrode SE1, the first drain electrode DE1, the second source electrode SE2, and the second drain electrode DE2. The first via insulating layer VIA1 may include an organic material. Examples of the organic material that may be used as the first via insulating layer VIA1 may include photoresist, polyacryl-based resin, polyimide-based resin, polyamide-based resin, siloxane-based resin, epoxy-based resin, etc. These may be used alone or in combination with each other.

The connection electrode CE may be disposed on the first via insulating layer VIA1. The connection electrode CE may be connected to the first drain electrode DE1 through a contact hole passing through the first via insulating layer VIA1. Accordingly, the connection electrode CE may electrically connect the first transistor TR1 and the light emitting element LD. For example, the connection electrode CE may include a metal, an alloy, a metal nitride, a conductive metal oxide, a transparent conductive material, etc. These may be used alone or in combination with each other.

The second via insulating layer VIA2 may be disposed on the first via insulating layer VIA1. The second via insulating layer VIA2 may be disposed with a relatively thick thickness to sufficiently cover the connection electrode CE. The second via insulating layer VIA2 may include an organic material. Examples of the organic material that may be used as the second via insulating layer VIA2 may include photoresist, polyacryl-based resin, polyimide-based resin, polyamide-based resin, siloxane-based resin, epoxy-based resin, etc. These may be used alone or in combination with each other.

The pixel electrode PE may be disposed on the second via insulating layer VIA2. The pixel electrode PE may be connected to the connection electrode CE through a contact hole passing through the second via insulating layer VIA2. For example, the pixel electrode PE may include a metal, an alloy, a metal nitride, a conductive metal oxide, a transparent conductive material, etc. These may be used alone or in combination with each other. For example, the pixel electrode PE may serve as an anode electrode.

The pixel defining layer PDL may be disposed on the second via insulating layer VIA2. The pixel defining layer PDL may cover an edge of the pixel electrode PE and may expose a portion of an upper surface of the pixel electrode PE. The pixel defining layer PDL may include an organic material and/or an inorganic material. Examples of the organic material that may be used as the pixel defining layer PDL may include photoresist, polyacryl-based resin, polyimide-based resin, polyamide-based resin, siloxane-based resin, epoxy-based resin, etc. These may be used alone or in combination with each other.

The light emitting layer EML may be disposed on the pixel electrode PE, at least part of which is exposed. The light emitting layer EML may include an organic material that emits light of a certain color (e.g., a preset color). For example, the light emitting layer EML may include an organic material that emits at least one of red light, green light, and blue light.

The common electrode CTE may be disposed on the pixel defining layer PDL and the light emitting layer EML. For example, the common electrode CTE may include a metal, an alloy, a metal nitride, a conductive metal oxide, a transparent conductive material, etc. These may be used alone or in combination with each other. For example, the common electrode CTE may serve as a cathode electrode.

Accordingly, the light emitting element LD including the pixel electrode PE, the light emitting layer EML, and the common electrode CTE may be formed.

The encapsulation layer TFE may be disposed on the common electrode CTE. The encapsulation layer TFE may prevent or substantially prevent impurities, moisture, and the like from permeating the light emitting element LD from the outside.

In an embodiment, the encapsulation layer TFE may include at least one inorganic layer and at least one organic layer. For example, the inorganic layer may include silicon oxide, silicon nitride, silicon oxynitride, etc. These may be used alone or in combination with each other. For example, the organic layer may include a polymer cured material, such as polyacrylate.

Although the display device DD of the present disclosure is shown and described as the organic light emitting display device ("OLED"), the configuration of the present disclosure is not limited thereto. For example, in other embodiments, the display device DD may include a liquid crystal display device ("LCD"), a field emission display device ("FED"), a plasma display device ("PDP"), an electrophoretic image display device ("EPD"), an inorganic light emitting display device ("ILED"), or a quantum dot display device.

Figure 5:
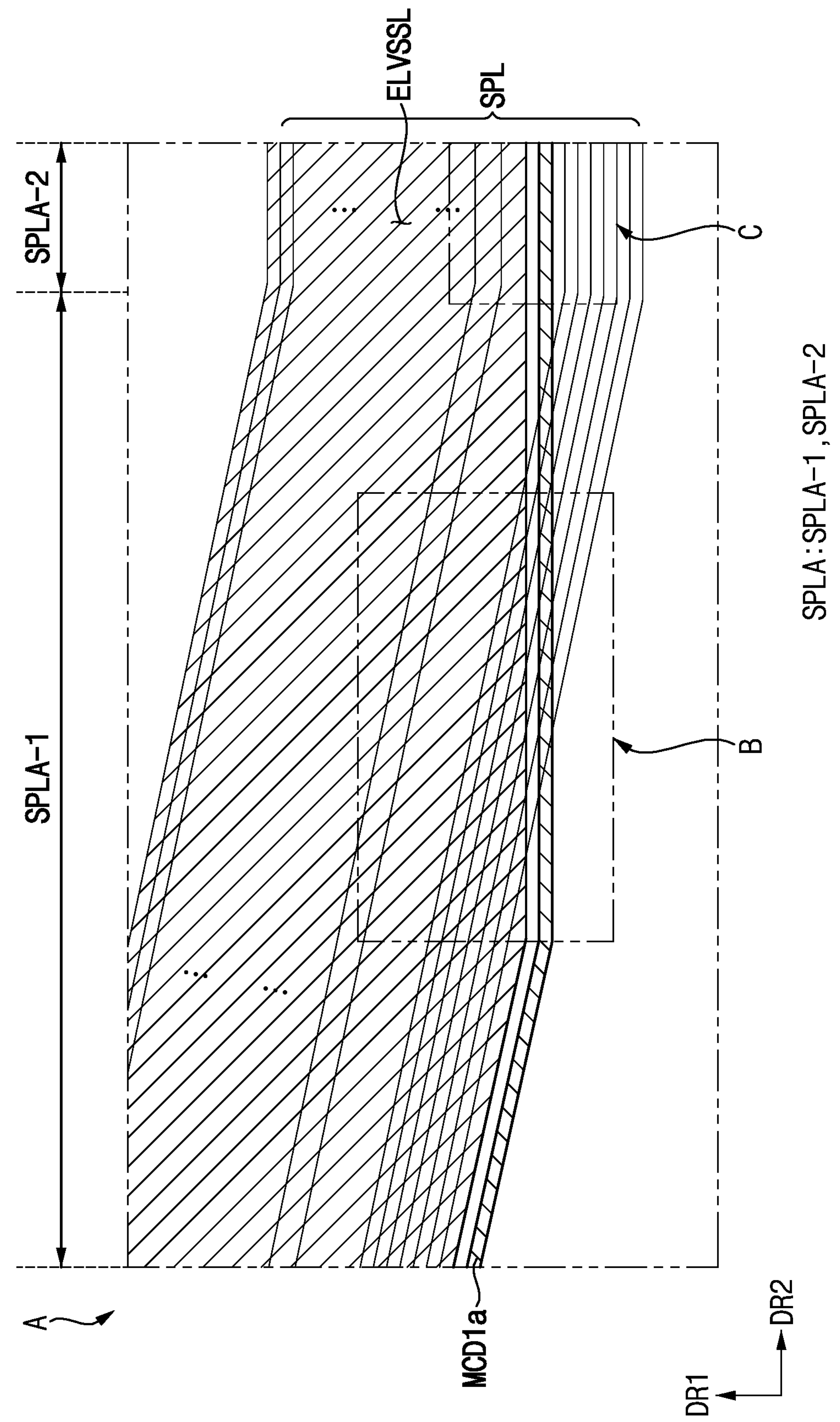
FIG. 5 is an enlarged plan view of a region "A" of FIG. 1.
Figure 6:
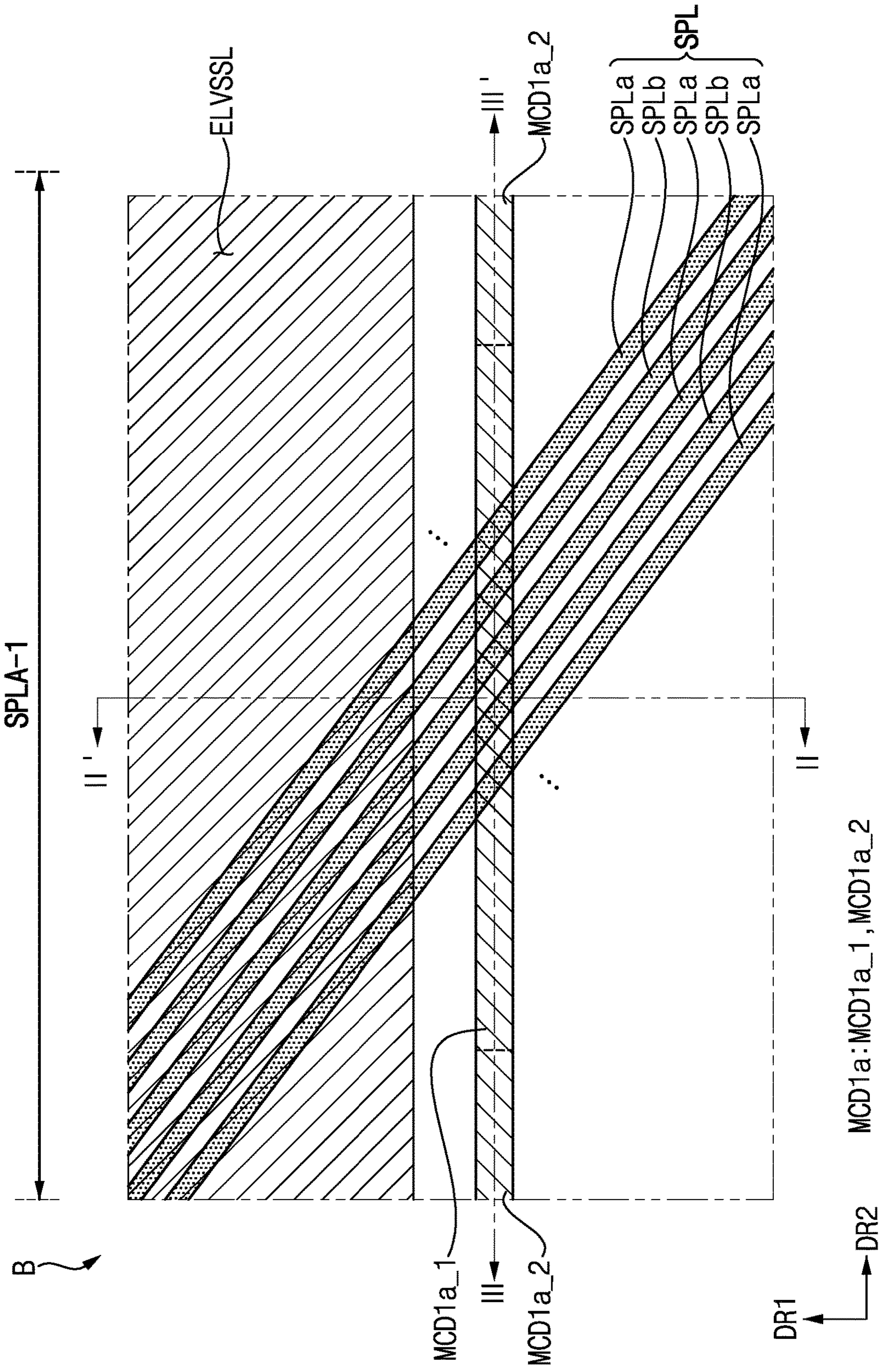
FIG. 6 is an enlarged plan view of a region "B" of FIG. 5.
Figure 7:
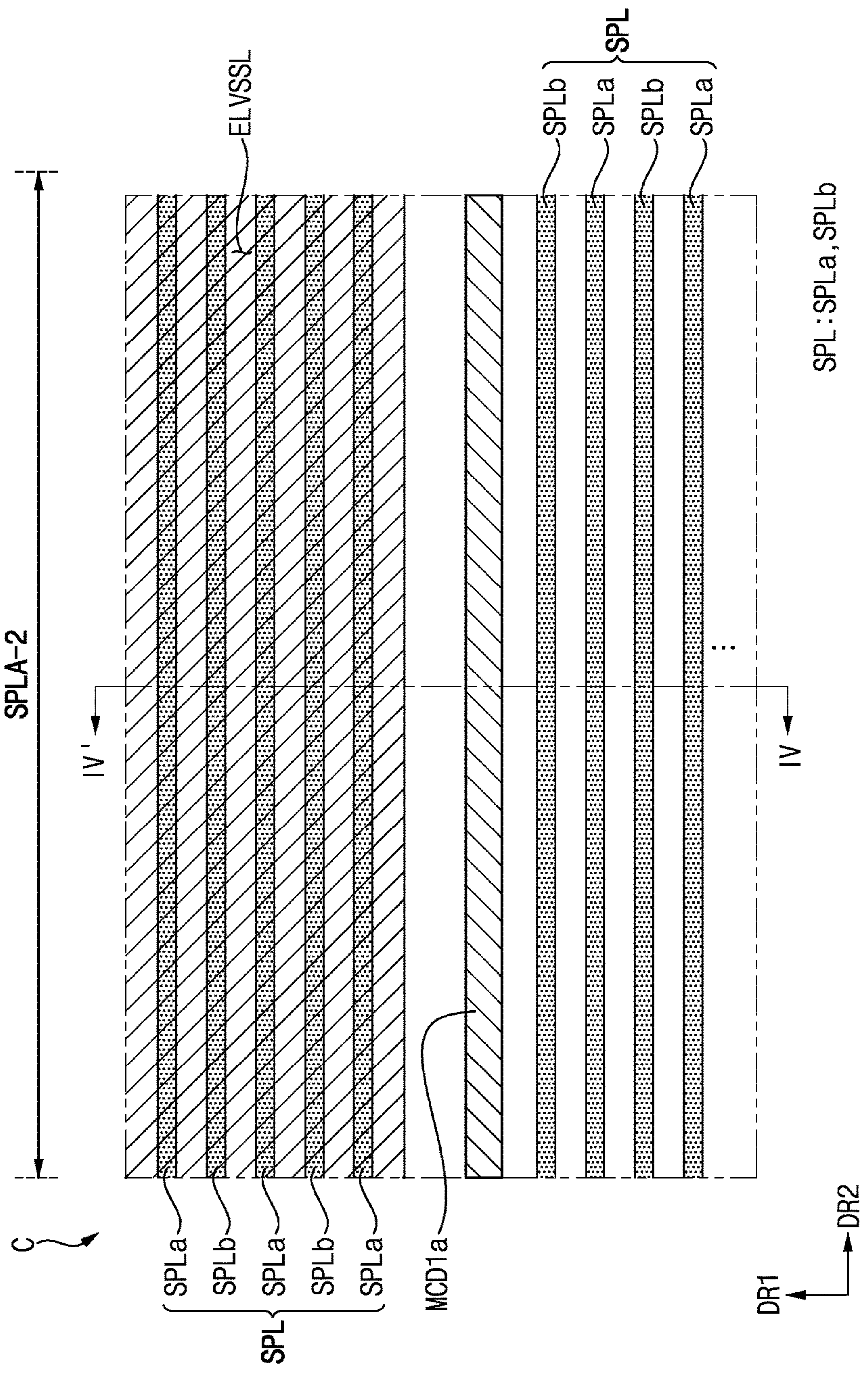
FIG. 7 is an enlarged plan view of a region "C" of FIG. 5.

FIG. 5 is an enlarged plan view of a region "A" of FIG. 1. FIG. 6 is an enlarged plan view of a region "B" of FIG. 5. FIG. 7 is an enlarged plan view of a region "C" of FIG. 5. The planar structure illustrated in FIG. 5 may be substantially the same as a part of the line area SPLA adjacent to one side of the display area DA of FIG. 1. Herein, descriptions overlapping descriptions of the display device DD described with reference to FIG. 1 may be omitted or simplified.

Referring to FIGS. 1, 5, 6, and 7, the display device DD may include the common voltage line ELVSSL, spider lines SPL, and the first crack detection line MCD1*a* disposed on the substrate SUB in the line area SPLA.

The line area SPLA on the substrate SUB may include a first line area SPLA-1 and a second line area SPLA-2. The first line area SPLA-1 may extend from a side of the display area DA. The second line area SPLA-2 may be adjacent to the first line area SPLA-1 and may extend along the second direction DR2.

The common voltage line EVLSSL may be disposed on the substrate SUB in the non-display area NDA and may extend to the first line area SPLA-1 and the second line area SPLA-2. The common voltage line ELVSSL may at least partially overlap the spider lines SPL on a plane.

The first crack detection line MCD1*a* may be disposed on the substrate SUB in the pad area PDA and may extend to the bending area BA and the peripheral area PA. In addition, the first crack detection line MCD1*a* may extend to the first line area SPLA-1 and the second line area SPLA-2.

The first crack detection line MCD1*a* may partially overlap the spider lines SPL on a plane. In an embodiment, the first crack detection line MCD1*a* may include a first line part MCD1*a*_1 overlapping the spider lines SPL on a plane and a second line MCD1*a*_2 not overlapping the spider lines SPL on a plane. The first crack 15 detection line MCD1*a* may be spaced apart from the common voltage line ELVSSL on a plane.

The spider lines SPL may be disposed on the substrate SUB in the line area SPLA. In an embodiment, the spider lines SPL may be disposed on the substrate SUB in the first line area SPLA-1 and the second line area SPLA-2. In an embodiment, for example, there may be about 80 spider lines SPL. However, the present disclosure is not limited thereto, and various numbers of spider lines SPL may be provided.

The spider lines SPL may include first spider lines SPLa and second spider lines SPLb. The first spider lines SPLa and the second spider lines SPLb may be spaced apart from each other on a plane. In an embodiment, the first spider lines SPLa may be disposed on a different layer from the second spider lines SPLb. A further description thereof will be provided later with reference to FIGS. 8, 9, 10, and 11.

In an embodiment, the spider lines SPL may extend in a first diagonal direction between the first direction DR1 and the second direction DR2 in the first line area SPLA-1. In addition, in the first line area SPLA-1, the first spider lines SPLa and the second spider lines SPLb may be alternately disposed along a second diagonal direction crossing the first diagonal direction.

The spider lines SPL may partially overlap the first crack detection line MCD1*a* on a plane in the first line area SPLA-1. In other words, in the first line area SPLA-1, the spider lines SPL may overlap the first line part MCD1*a*_1 and may not overlap the second line part MCD1*a*_2 on a plane.

By disposing the first crack detection line MCD1*a* to at least partially overlap the spider lines SPL in the first line area SPLA-1, an area of the non-display area NDA of the display device DD may be relatively reduced. Accordingly, a dead space of the display device DD may be reduced.

In an embodiment, the spider lines SPL may extend in the second direction DR2 in the second line area SPLA-2. In an embodiment, in the second line area SPLA-2, the first spider lines SPLa and the second spider lines SPLb may be alternately disposed along the first direction DR1.

The spider lines SPL may be spaced apart from the first crack detection line MCD1*a* on a plane in the second line area SPLA-2. In an embodiment, as illustrated in FIG. 7, the first crack detection line MCD1*a* may be disposed between the spider lines SPL overlapping the common voltage line EVLSSL on a plane and the spider lines SPL not overlapping the common voltage line EVLSSL on a plane.

Figure 8:
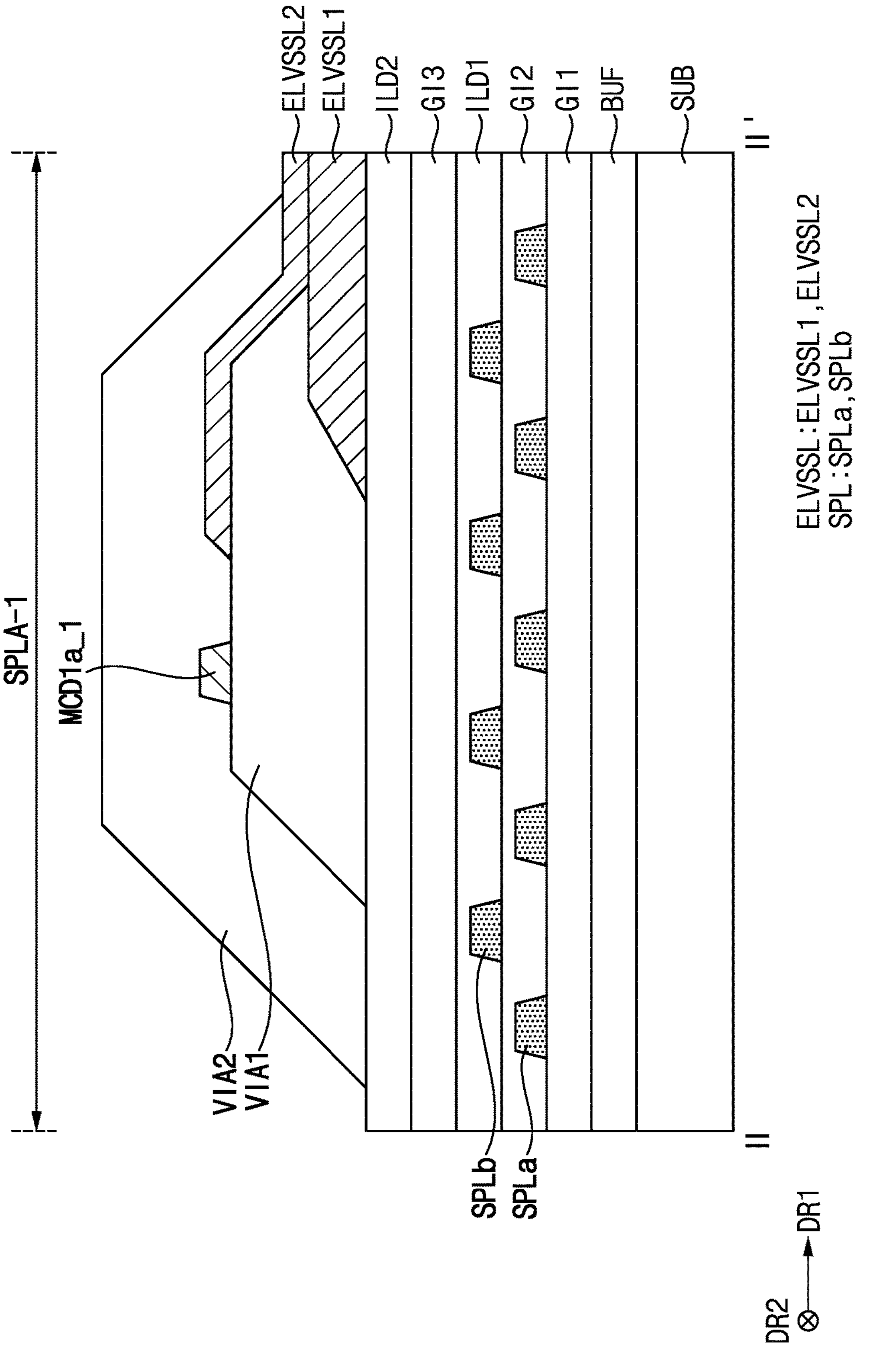
FIG. 8 is a cross-sectional view illustrating an example of a cross-section taken along the line II-II' of FIG. 6.
Figure 9:
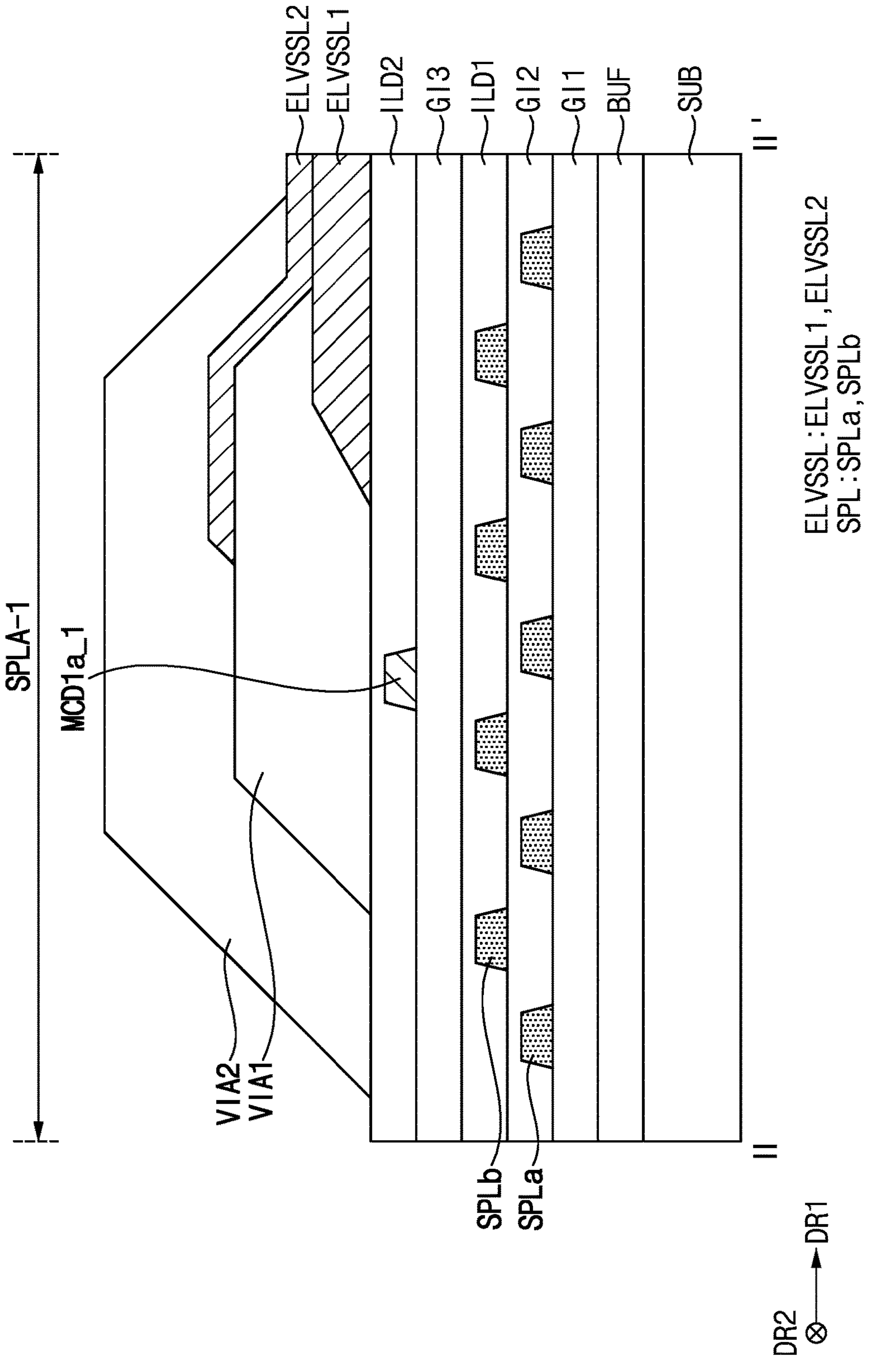
FIG. 9 is a cross-sectional view illustrating another example of a cross-section taken along the line II-II' of FIG. 6.
Figure 10:
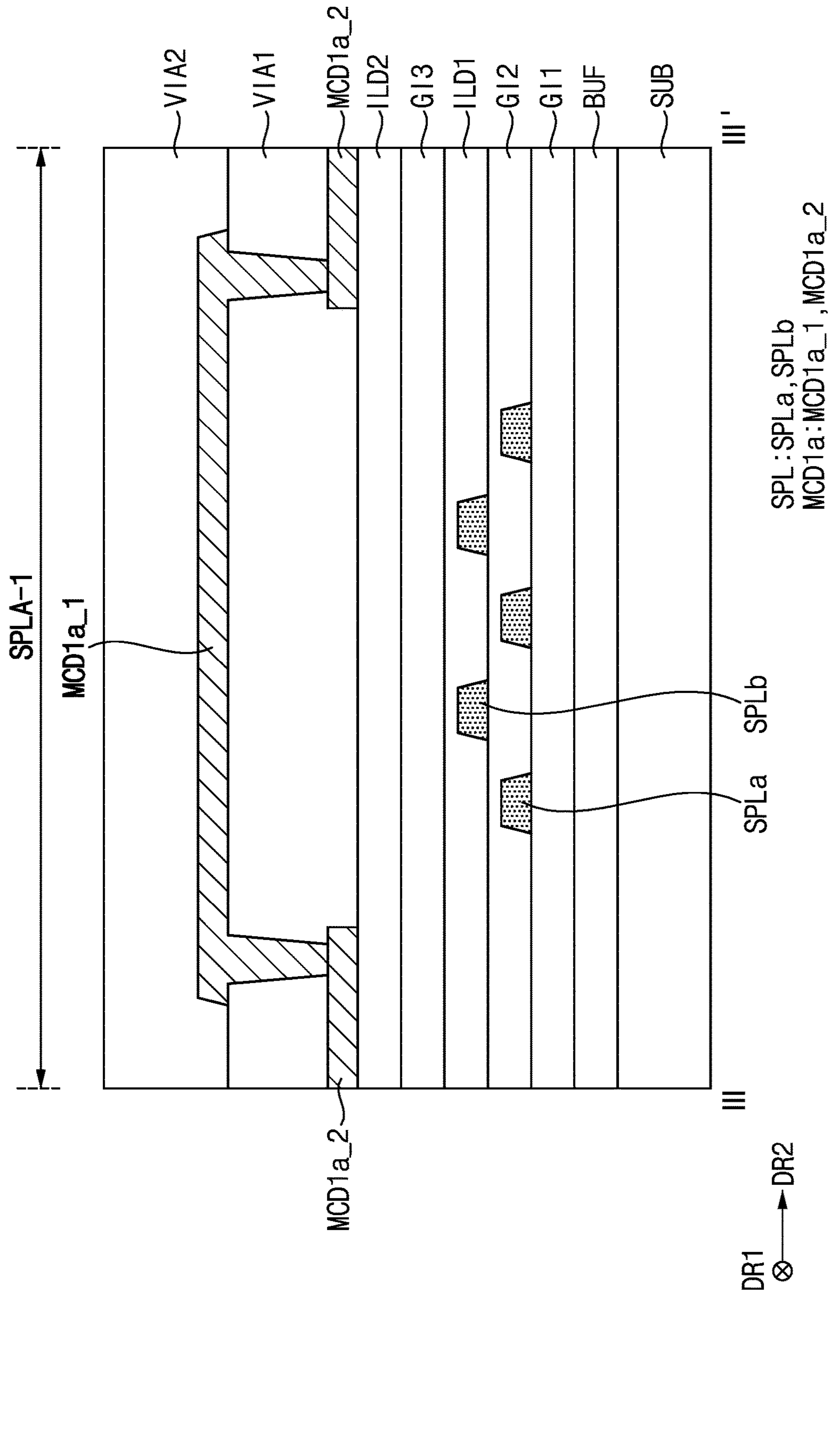
FIG. 10 is a cross-sectional view taken along the line III-III' of FIG. 6.

FIG. 8 is a cross-sectional view illustrating an example of a cross-section taken along the line II-II' of FIG. 6. FIG. 9 is a cross-sectional view illustrating another example of a cross-section taken along the line II-II' of FIG. 6. FIG. 10 is a cross-sectional view taken along the line III-III' of FIG. 6. Herein, descriptions overlapping descriptions of the display device DD described with reference to FIG. 4 may be omitted or simplified.

Referring to FIGS. 8, 9, and 10, the display device DD according to an embodiment of the present disclosure may include the substrate SUB, the buffer layer BUF, and the first to third gate insulating layers GI1, GI2, and GI3, the first and second inter-layer insulating layers ILD1 and ILD2, the first and second via insulating layers VIA1 and VIA2, the spider lines SPL, the common voltage line ELVSSL, and the first crack detection line MCD1*a*. In this case, the first crack detection line MCD1*a* may include the first line part MCD1*a*_1 and the second line part MCD1*a*_2.

The spider lines SPL may be disposed on a different layer from the first crack detection line MCD1*a*. The spider lines SPL may include the first spider lines SPLa and the second spider lines SPLb. In an embodiment, the first spider lines SPLa may be disposed on a different layer from the second spider lines SPLb. For example, the first spider lines SPLa may be disposed on the same layer as the first gate electrode (e.g., the first gate electrode GE1 of FIG. 4), and the second spider lines SPLb may be disposed on the same layer as the second gate electrode (e.g., the second gate electrode GE2 of FIG. 4). In an embodiment, the first spider lines SPLa may be formed using the same material as the first gate electrode through the same process, and the second spider lines SPLb may be formed using the same material as the second gate electrode through the same process.

In an embodiment, for example, a separation distance on a plane between the first spider line SPLa and the second spider line SPLb may be about 0.3 micrometers.

The common voltage line ELVSSL may be disposed on the second inter-layer insulating layer ILD2. In an embodiment, the common voltage line ELVSSL may have a multilayer structure. For example, the common voltage line ELVSSL may include a first layer ELVSSL1 and a second layer ELVSSL2 disposed on the first layer ELVSSL1. In an embodiment, the first layer ELVSSL1 may be disposed on the same layer as the source electrode (e.g., the first source electrode SE1 and the second source electrode SE2 of FIG. 4) and the drain electrode (e.g., the first drain electrode DE1 and the second drain electrode DE2 of FIG. 4). In addition, the second layer ELVSSL2 may be disposed on the same layer as the connection electrode (e.g., the connection electrode CE of FIG. 4). In an embodiment, the first layer ELVSSL1 may be formed using the same material as the source electrode and the drain electrode through the same process. In addition, the second layer ELVSSL2 may be formed using the same material as the connection electrode through the same process.

The first line part MCD1*a*_1 overlapping the spider lines SPL on a plane may be disposed on the first via insulating layer VIA1 in the first line area SPLA-1. As illustrated in FIG. 8, in an embodiment, the first line part MCD1*a*_1 may be disposed on the same layer as the connection electrode. In an embodiment, the first line part MCD1*a*_1 may be formed using the same material as the connection electrode through the same process.

In an embodiment, the first line part MCD1*a*_1 may be disposed on the same layer as the second layer ELVSSL2 of the common voltage line ELVSSL in the first line area SPLA-1. In an embodiment, for example, a separation distance on a plane between the first line part MCD1*a*_1 and the second layer ELVSSL2 may be about 3.5 micrometers.

As illustrated in FIG. 9, in another embodiment, the first line part MCD1*a*_1 may be disposed on the third gate insulating layer GI3 in the first line area SPLA-1. That is, the first line part MCD1*a*_1 may be disposed on the same layer as the third gate electrode (e.g., the third gate electrode GE3 of FIG. 4). In an embodiment, the first line part MCD1*a*_1 may be formed using the same material as the third gate electrode through the same process.

As illustrated in FIG. 10, in an embodiment, the first line part MCD1*a*_1 may be disposed on a different layer from the second line part MCD1*a*_2.

For example, in the first line area SPLA-1, the first line part MCD1*a*_1 may be disposed above the second line part MCD1*a*_2. In an embodiment, the first line part MCD1*a*_1 may be disposed on the same layer as the connection electrode, and the second line part MCD1*a*_2 may be disposed on the same layer as the source electrode and the drain electrode. In an embodiment, the first line part MCD1*a*_1 may be formed using the same material as the connection electrode through the same process. In an embodiment, the second line part MCD1*a*_2 may be formed using the same material as the source electrode and the drain electrode through the same process. However, the present disclosure is not limited thereto.

In an embodiment, in the first line area SPLA-1, the first line part MCD1*a*_1 may be disposed under the second line part MCD1*a*_2. The first line part MCD1*a*_1 may be disposed on the same layer as the third gate electrode, and the second line part MCD1*a*_2 may be disposed on the same layer as the source electrode and the drain electrode. In an embodiment, the first line part MCD1*a*_1 may be formed using the same material as the third gate electrode through the same process. In addition, the second line part MCD1*a*_2 may be formed using the same material as the source electrode and the drain electrode through the same process.

In a process of forming the spider lines, a stringer defect in which a metal film remains may occur. For example, in a process of forming the spider lines, a defect in which a metal film remains on a layer where the source electrode and the drain electrode are disposed in an area overlapping the spider lines on a plane may occur.

Embodiments of the present disclosure may include the first line part MCD1*a*_1 overlapping the spider lines SPL on a plane in the first line area SPLA-1. As the first line part MCD1*a*_1 is disposed on a layer other than the layer on which the source electrode and the drain electrode are disposed, even if a defect in which a metal film remains occurs, the first line part MCD1*a*_1 may not be electrically shorted to the common voltage line ELVSSL. For example, the first line part MCD1*a*_1 may be disposed on the same layer as the connection electrode. That is, by disposing the first line part MCD1*a*_1 on the first via insulating layer VIA1 having a relatively thick thickness, the first line part MCD1*a*_1 may not be electrically shorted to the common voltage line ELVSSL.

Figure 11:
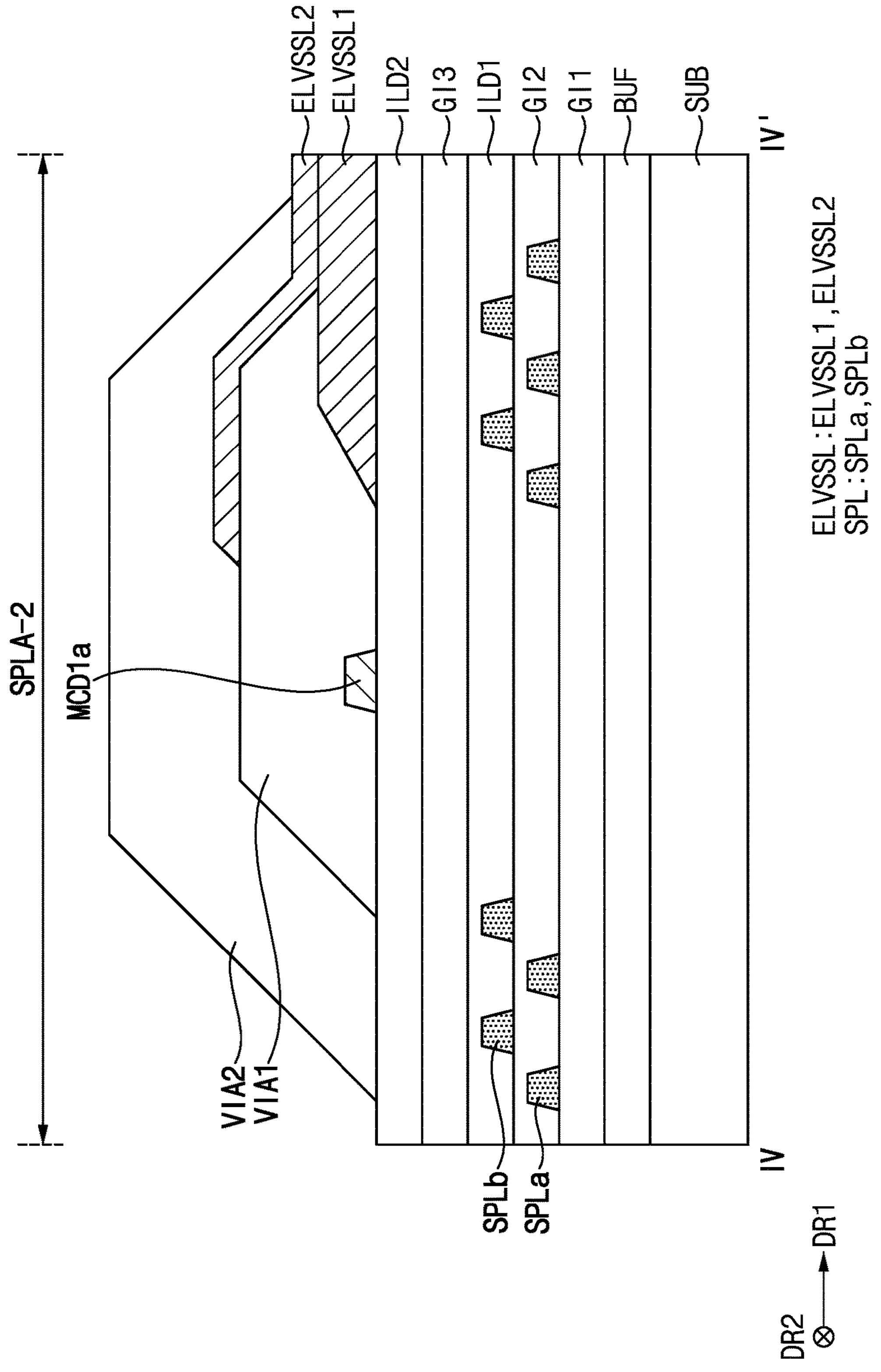
FIG. 11 is a cross-sectional view taken along the line IV-IV' of FIG. 7.

FIG. 11 is a cross-sectional view taken along the line IV-IV' of FIG. 7. Herein, descriptions overlapping descriptions of the display device described with reference to FIG. 8 may be omitted or simplified.

Referring to FIG. 11, the display device DD according to an embodiment of the present disclosure may include the substrate SUB, the buffer layer BUF, the first to third gate insulating layers GI1, GI2, and GI3, the first and second inter-layer insulating layers ILD1 and ILD2, the first and second via insulating layers VIA1 and VIA2, the spider lines SPL, the common voltage line ELVSSL, and the first crack detection line MCD1*a*.

The spider lines SPL may be disposed on a different layer from the first crack detection line MCD1*a*. The spider lines SPL may include the first spider lines SPLa and the second spider lines SPLb. In an embodiment, for example, a separation distance on a plane between the first spider line SPLa and the second spider line SPLb may be about 0.3 micrometers.

The common voltage line ELVSSL may be disposed on the second inter-layer insulating layer ILD2. In an embodiment, the common voltage line ELVSSL may have a multilayer structure. For example, the common voltage line ELVSSL may include the first layer ELVSSL1 and the second layer ELVSSL2 disposed on the first layer ELVSSL1. In an embodiment, the first layer ELVSSL1 may be disposed on the same layer as the source electrode and the drain electrode, and the second layer ELVSSL2 may be disposed on the same layer as the connection electrode.

The first crack detection line MCD1*a* may be disposed on the second inter-layer insulating layer ILD2 in the second line area SPLA-2. In an embodiment, the first crack detection line MCD1*a* may be disposed on the same layer as the source electrode and the drain electrode. In an embodiment, the first crack detection line MCD1*a* may be formed using the same material as the source electrode and the drain electrode through the same process.

In an embodiment, the first crack detection line MCD1*a* may be disposed on the same layer as the first layer ELVSSL1 of the common voltage line ELVSSL in the second line area SPLA-2. In an embodiment, for example, a separation distance on a plane between the first crack detection line MCD1*a* and the first layer ELVSSL1 may be about 5.5 micrometers.

The first crack detection line MCD1*a* may be spaced apart from the spider lines SPL on a plane in the second line area SPLA-2. The first crack detection line MCD1*a* may be disposed between the spider lines SPL overlapping the common voltage line ELVSSL on a plane and the spider lines SPL not overlapping the common voltage line ELVSSL on a plane.

In a process of forming spider lines, a defect in which the metal film remains on the layer where the source electrode and the drain electrode are disposed in an area overlapping the spider lines on a plane may occur.

However, embodiments of the present disclosure include the first crack detection line MCD1*a* spaced apart from the spider lines SPL on a plane in the second line area SPLA-2. As the first crack detection line MCD1*a* is spaced apart from the spider lines SPL on a plane, even if a defect in which a metal film remains occurs, the first crack detection line MCD1*a* may not be electrically shorted to the common voltage line ELVSSL.

Embodiments of the present disclosure can be applied to various display devices. For example, embodiments of the present disclosure are applicable to various display devices, such as display devices for vehicles, ships and aircraft, portable communication devices, display devices for exhibition or information transmission, medical display devices, and the like.

The foregoing is illustrative of some example embodiments of the present disclosure, and is not to be construed as limiting thereof. Although some example embodiments have been described with reference to the figures, those skilled in the art will readily appreciate that many variations and modifications may be made therein without departing from the spirit and scope of the present disclosure as set forth in the appended claims.

What is claimed is:

1. A display device comprising:

a substrate comprising a display area and a non-display area including a line area adjacent to a side of the display area;

a plurality of data lines on the substrate in the display area;

a crack detection line on the substrate in the non-display area, extending to the line area, and comprising a first line part and a second line part connected to the first line part; and a plurality of spider lines on the substrate in the line area to receive a data voltage, connected to the plurality of data lines, and overlapping the first line part and not overlapping the second line part on a plane.

2. The display device of claim 1, wherein the first line part is on a different layer from the second line part.

3. The display device of claim 2, wherein the first line part is above the second line part.

4. The display device of claim 1, wherein data lines of the plurality of data lines extend in a first direction, and are arranged along a second direction crossing the first direction, wherein each of the plurality of spider lines extends in a first diagonal direction between the first direction and the second direction in the line area.

5. The display device of claim 4, wherein the plurality of spider lines comprises first spider lines and second spider lines, and the first spider lines and the second spider lines are alternately arranged along a second diagonal direction crossing the first diagonal direction.

6. The display device of claim 5, wherein the first spider lines are on a different layer from the second spider lines.

7. The display device of claim 1, further comprising:

a pad portion on the substrate in the non-display area, wherein an end of the crack detection line is connected to the pad portion.

8. A display device comprising:

a substrate comprising a display area and a non-display area including a line area adjacent to a side of the display area;

a crack detection line on the substrate in the non-display area, extending to the line area, and comprising a first line part and a second line part connected to the first line part;

a plurality of spider lines on the substrate in the line area to receive a data voltage, and overlapping the first line part and not overlapping the second line part on a plane;

a first active pattern on the substrate in the display area;

a first gate electrode on the first active pattern;

a second gate electrode on the first gate electrode;

a second active pattern on the second gate electrode;

a third gate electrode on the second active pattern;

a source electrode and a drain electrode on the third gate electrode; and a connection electrode on the drain electrode.

9. The display device of claim 8, wherein a part of the plurality of spider lines is on a same layer as the first gate electrode, and another part of the plurality of spider lines is on a same layer as the second gate electrode.

10. The display device of claim 9, wherein the first line part of the crack detection line is on a same layer as the connection electrode, and the second line part of the crack detection line is on a same layer as the source electrode and the drain electrode.

11. The display device of claim 9, wherein the first line part of the crack detection line is on a same layer as the third gate electrode, and the second line part of the crack detection line is on a same layer as the source electrode and the drain electrode.

12. A display device comprising:

a substrate comprising a display area and a non-display area including a first line area adjacent to a side of the display area and a second line area adjacent to the first line area and extending in a second direction crossing a first direction;

a plurality of data lines on the substrate in the display area, extending in the first direction, and arranged along the second direction;

a crack detection line on the substrate in the non-display area, extending to the first line area and the second line area, and comprising a first line part and a second line part connected to the first line part; and a plurality of spider lines on the substrate in the first line area and the second line area, connected to the plurality of data lines, overlapping the first line part on a plane in the first line area, not overlapping the second line part on the plane in the first line area, and spaced apart from the crack detection line on the plane in the second line area.

13. The display device of claim 12, wherein the first line part is on a different layer from the second line part.

14. The display device of claim 12, wherein the plurality of spider lines extends in a diagonal direction between the first direction and the second direction in the first line area, and the plurality of spider lines extends in the second direction in the second line area.

15. The display device of claim 12, further comprising:

a first active pattern on the substrate in the display area;

a first gate electrode on the first active pattern;

a second gate electrode on the first gate electrode;

a second active pattern on the second gate electrode;

a third gate electrode on the second active pattern;

a source electrode and a drain electrode on the third gate electrode; and a connection electrode on the drain electrode.

16. The display device of claim 15, wherein the first line part of the crack detection line is on a same layer as the connection electrode, and the second line part of the crack detection line is on a same layer as the source electrode and the drain electrode.

17. The display device of claim 15, wherein the first line part of the crack detection line is on a same layer as the third gate electrode, and the second line part of the crack detection line is on a same layer as the source electrode and the drain electrode.

18. The display device of claim 15, further comprising:

a common voltage line on the substrate in the non-display area and extending to the first line area and the second line area.

19. The display device of claim 18, wherein the common voltage line at least partially overlaps the plurality of spider lines on the plane in the first line area and the second line area, and the common voltage line comprises a first layer on a same layer as the source electrode and the drain electrode and a second layer on a same layer as the connection electrode.

20. The display device of claim 19, wherein, in the second line area, the crack detection line is between spider lines overlapping the common voltage line on the plane and spider lines not overlapping the common voltage line on the plane among the plurality of spider lines.

* * * * *